US009995782B2

(12) United States Patent
Kawanaka et al.

(10) Patent No.: US 9,995,782 B2
(45) Date of Patent: Jun. 12, 2018

(54) INSULATION PROBLEM DETECTION APPARATUS

(71) Applicant: FUJITSU TEN LIMITED, Kobe-shi, Hyogo (JP)

(72) Inventors: Shota Kawanaka, Kobe (JP); Sho Tamura, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days. days.

(21) Appl. No.: 15/362,054

(22) Filed: Nov. 28, 2016

(65) Prior Publication Data

US 2017/0160333 A1 Jun. 8, 2017

(30) Foreign Application Priority Data

Dec. 4, 2015 (JP) ................................. 2015-237744

(51) Int. Cl.
*G01R 31/12* (2006.01)
*G01R 31/00* (2006.01)
*G01R 27/02* (2006.01)

(52) U.S. Cl.
CPC ....... *G01R 31/1272* (2013.01); *G01R 27/025* (2013.01); *G01R 31/007* (2013.01)

(58) Field of Classification Search
CPC . G01R 31/007; G01R 27/025; G01R 31/1272
USPC .............. 324/500, 750.01, 527–537, 750.15, 324/757.02, 763.01, 425, 519, 750.17, 324/754.28, 548, 658
See application file for complete search history.

(56) References Cited

U.S. PATENT DOCUMENTS

2013/0176037 A1* 7/2013 Waki ....................... G01D 9/005
324/658
2013/0245869 A1* 9/2013 Nishida ................. B60L 3/0069
701/22

FOREIGN PATENT DOCUMENTS

| JP | 2006211825 A | 8/2006 |
| JP | 2006337130 A | 12/2006 |
| JP | 2008191137 A | 8/2008 |
| JP | 2012016223 A | 1/2012 |
| JP | 2013162639 A | 8/2013 |
| JP | 2014195372 A | 10/2014 |

* cited by examiner

*Primary Examiner* — Melissa Koval
*Assistant Examiner* — Trung Nguyen
(74) *Attorney, Agent, or Firm* — Oliff PLC

(57) ABSTRACT

An insulation problem detection apparatus includes a microcomputer configured to: control a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged; obtain a total voltage of the power supply from an external apparatus that is external to the microcomputer when the insulation resistance of the vehicle is measured by the voltage detecting circuit; and detect whether there is an insulation problem of the vehicle based on (i) the total voltage of the power supply obtained from the external apparatus and (ii) the insulation resistance of the vehicle measured by the voltage detecting circuit.

12 Claims, 7 Drawing Sheets

INSULATION PROBLEM DETECTION APPARATUS

BACKGROUND OF THE INVENTION

Field of the Invention

The invention relates to an insulation problem detection apparatus and an insulation problem detection method.

Description of the Background Art

Vehicles such as hybrid vehicles and electric vehicles that have been widespread these days include a power supply that supplies power to a motor that is a power source. The power supply includes an assembled battery made by a plurality of stacked storage cells. A voltage output from the power supply is supplied to the motor after the voltage is boosted by a voltage converter.

There is a technology that detects an insulation problem of a vehicle in the foregoing configuration based on a voltage at which a flying capacitor is charged, for example, having the power supply, the flying capacitor, an insulation resistance of a vehicle and a vehicle body ground connected in series. Moreover, when detecting the insulation problem, the technology charges the flying capacitor by a total voltage of the power supply, having the power supply and the flying capacitor connected in series, and then uses a total voltage of battery supply measured based on the voltage.

However, the foregoing technology has a problem of low accuracy of the measured voltage of the charged flying capacitor. For example, the voltage boosted by the voltage converter fluctuates because measurement time points are different. Therefore, different reverse charge occurs whenever the flying capacitor is charged so that in some cases, accurate insulation resistance cannot be measured. Moreover, for example, since the time points of measurement are different, measured total voltages of the power supply are different, and thus there is a case where accuracy of the total voltage of the power supply may be decreased. In other words, if the foregoing technology is used, because the accuracy of the measured voltage of the flying capacitor is low, accuracy of the measured insulation resistance and accuracy of the measured total voltage of the power supply of the vehicle are also low. Accordingly, there is a problem that the insulation problem of the vehicle cannot be detected accurately.

SUMMARY OF THE INVENTION

According to one aspect of the invention, an insulation problem detection apparatus includes a microcomputer configured to: control a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged; obtain a total voltage of the power supply from an external apparatus that is external to the microcomputer when the insulation resistance of the vehicle is measured by the voltage detecting circuit; and detect whether there is an insulation problem of the vehicle based on (i) the total voltage of the power supply obtained from the external apparatus and (ii) the insulation resistance of the vehicle measured by the voltage detecting circuit.

Thus, the insulation problem of the vehicle can be detected accurately.

According to another aspect of the invention, an insulation problem detection apparatus includes a microcomputer configured to: control a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged; obtain, from an external apparatus that is external to the microcomputer, a boost voltage of a boosting circuit that boosts an output voltage output by the power supply mounted in the vehicle, when the insulation resistance of the vehicle is measured by the voltage detecting circuit; and detect whether there is an insulation problem of the vehicle based on the insulation resistance of the vehicle measured by the voltage detecting circuit in accordance with the boost voltage obtained from the external apparatus.

Thus, it is possible to prevent decrease of accuracy of insulation problem detection due to change of the boost voltage of a voltage boosting apparatus, and also possible to shorten a time period and improve an efficiency of an insulation problem detection process by decreasing false insulation problem detection.

Therefore, an object of the invention is to provide an insulation problem detection apparatus that accurately detects an insulation problem of a vehicle.

These and other objects, features, aspects and advantages of the invention will become more apparent from the following detailed description of the invention when taken in conjunction with the accompanying drawings.

DESCRIPTION OF THE EMBODIMENTS

An example of an embodiment of an insulation problem detection apparatus and an insulation problem detection method of the invention will be described below with reference to the drawings. In the embodiment below, a configuration and processes relating to the invention will be mainly described and other configurations and processes will be omitted. Moreover, the embodiment described below is not intended to limit the disclosed technology. Further, the embodiment and each of modifications may be combined with one another arbitrarily if combination does not cause contradiction. In the embodiments, same numerical references are given to same elements or same steps, and explanation of elements and steps, if described earlier, will be omitted.

Embodiment (Charging and Discharging System)

Figure 1:
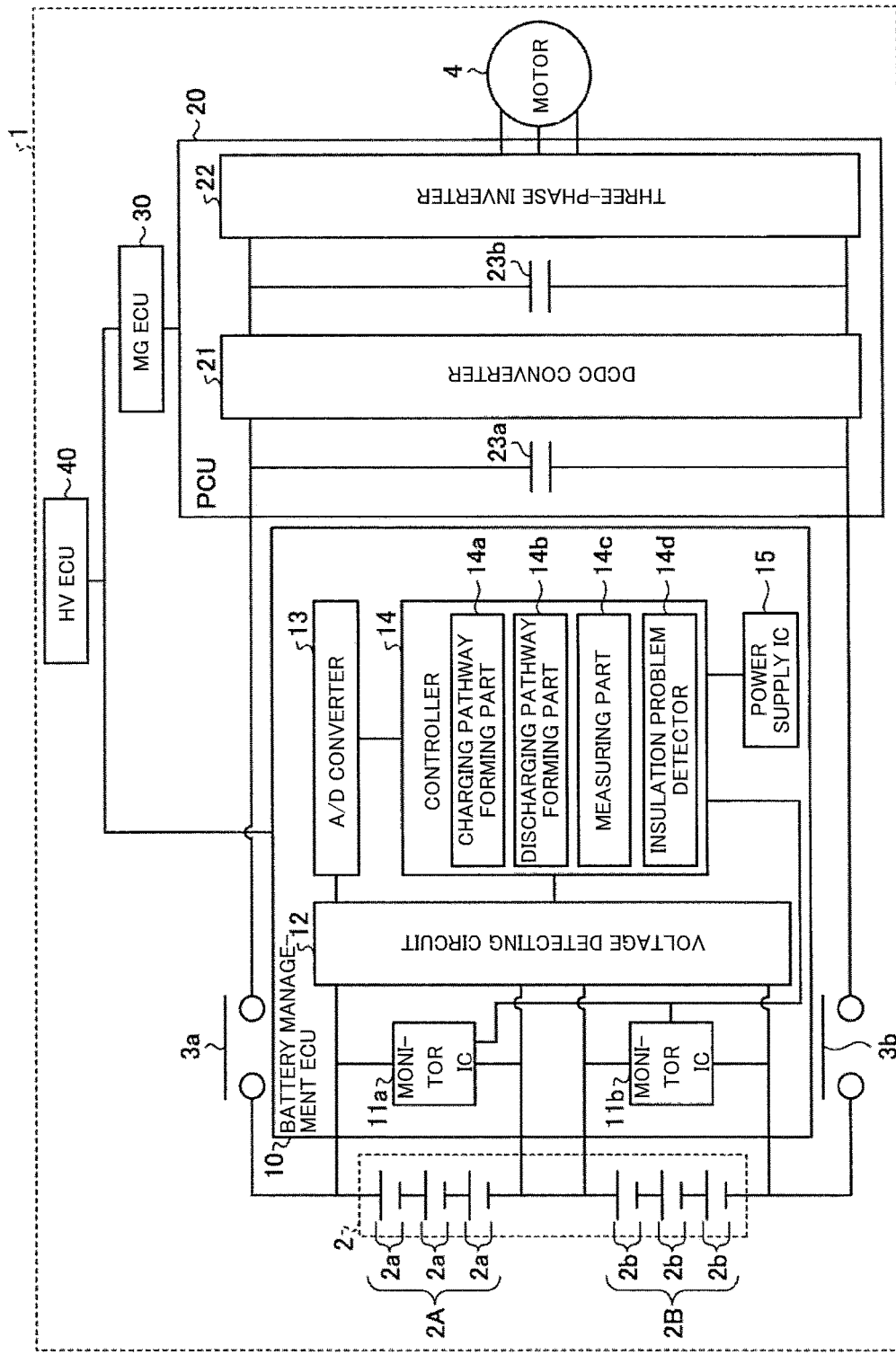
FIG. 1 illustrates an example of a vehicle-mounted system of this embodiment.

FIG. 1 illustrates an example of a vehicle-mounted system of this embodiment. A vehicle-mounted system 1 is mounted on a vehicle, such as a hybrid electric vehicle (HEV), an electric vehicle (EV) and a fuel cell vehicle (FCV). The vehicle-mounted system 1 performs control including charging and discharging of a power supply that supplies power to a motor that is a power source of the vehicle.

The vehicle-mounted system 1 includes an assembled battery 2, a SMR (system main relay) 3a, a SMR 3b, a motor 4, a battery management ECU 10, a PCU (power control unit) 20, a MG ECU (motor generator ECU) 30 and a HV ECU (hybrid ECU) 40. The term ECU is an abbreviation of electric control unit.

The assembled battery 2 is the power supply (battery) insulated from a vehicle body, not illustrated, and is configured to include a plurality, for example, two, of cell stacks 2A and 2B connected in series. The cell stacks 2A and 2B include a plurality, for example, three of battery cells 2a and of battery cells 2b, respectively. In other words, the assembled battery 2 is a high pressure DC power supply.

Numbers of cell stacks and battery cells are not limited to the aforementioned or an illustration in the drawing. Moreover, a lithium ion secondary battery, a nickel hydride secondary battery and the like can be used for the battery cell. However, the battery cell is not limited to those batteries.

The SMR 3a is controlled by the HV ECU 40 to be turned on and off. While being turned on, the SMR 3a connects the PCU 20 to a highest voltage side of the assembled battery 2. While being turned on, the SMR 3b connects the PCU 20 to a lowest voltage side of the assembled battery 2.

(Battery Management ECU)

The battery management ECU 10 is an electronic control apparatus that monitors a state of the assembled battery 2 and that controls the assembled battery 2. The battery management ECU 10 includes a monitor IC (integrated circuit) 11a, a monitor IC 11b, a voltage detecting circuit 12, an A/D (analog/digital) converter 13, a controller 14 and a power supply IC 15. The power supply IC 15 supplies power to the monitor IC 11a, the monitor IC 11b, the voltage detecting circuit 12, the A/D converter 13 and the controller 14.

The monitor IC 11a is connected to each of the plurality of the battery cells 2a so as to monitor a voltage of each battery cell 2a. Moreover, the monitor IC 11a is connected to a highest voltage side and a lowest voltage side of the cell stack 2A so as to monitor a voltage of the cell stack 2A. The monitor IC 11b is connected to each of the plurality of the battery cells 2b so as to monitor a voltage of each battery cell 2b. Moreover, the monitor IC 11b is connected to a highest voltage side and a lowest voltage side of the cell stack 2B so as to monitor a voltage of the cell stack 2B.

A monitor IC may be provided to each battery cell or a monitor IC may be provided to the assembled battery 2. In a case where one monitor IC is provided to each battery cell, the controller 14 uses, as a total voltage of the assembled battery 2, a sum of voltages of the cell stacks each of which is monitored by each monitor IC. Moreover, in a case where one monitor IC is provided to the assembled battery 2, the controller 14 uses the total voltage of the assembled battery 2 monitored by the monitor IC. The monitor ICs 11a and 11b are external units of the controller 14.

(Voltage Detecting Circuit)

Figure 2:
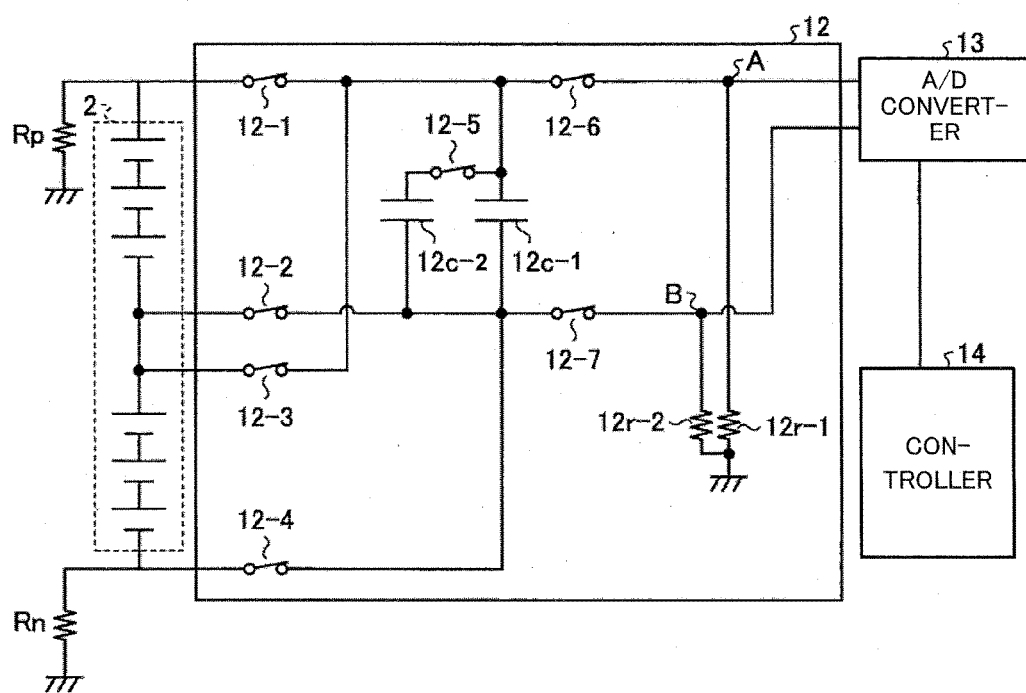
FIG. 2 illustrates an example of a voltage detecting circuit of this embodiment.

FIG. 2 illustrates an example of a voltage detecting circuit of this embodiment. FIG. 2 is only an example of the voltage detecting circuit, and other circuit configurations having a similar function can be used. As illustrated in FIG. 2, the voltage detecting circuit 12 includes a first switch 12-1 to a seventh switch 12-7, a capacitor 12c-1, a capacitor 12c-2, a first resistor 12r-1 and a second resistor 12r-2. Solid state relays (SSR) may be used as the first switch 12-1 to the seventh switch 12-7. However, the switch is not limited to the solid state relay.

Here, the capacitor 12c-1 and the second capacitor 12c-2 are used as a flying capacitor. When the fifth switch 12-5 is turned on, the capacitor 12c-1 and the second capacitor 12c-2 are connected in parallel so as to function as the flying capacitor. Moreover, when the fifth switch 12-5 is turned off, the second capacitor 12c-2 is excluded from the voltage detecting circuit 12 and thus only the capacitor 12c-1 functions as the flying capacitor.

Whether both of the capacitors 12c-1 and 12c-2 are used as the flying capacitors or only the capacitor 12c-1 is used as the flying capacitor can be changed appropriately, depending on an object to be measured based on a voltage of a charged flying capacitor. A case where the fifth switch 12-5 is turned off so as to cause only the capacitor 12c-1 to function as the flying capacitor will be described below. However, the case is not limited to this but a case where the fifth switch 12-5 is turned on so as to cause the capacitors 12c-1 and 12c-2 to both function as the flying capacitors is the same.

In the voltage detecting circuit 12, the capacitor 12c-1 is charged by the voltage of the cell stack 2A, the voltage of the cell stack 2B and the total voltage of the assembled battery 2. Then, in the voltage detecting circuit 12, the voltage of the charged capacitor 12c-1 is detected as a sum of the voltage of the cell stack 2A, the voltage of the cell stack 2B and the total voltage of the assembled battery 2.

More specifically, the voltage detecting circuit 12 is divided by the capacitor 12c-1 into a charging pathway and a discharging pathway. In the charging pathway, the capacitor 12c-1 is connected in parallel to each of the cell stack 2A and the cell stack 2B of the assembled battery 2 and the assembled battery 2 itself, and the charging pathway includes a pathway for charging the capacitor 12c-1 by each of the voltage of the cell stack 2A, the voltage of the cell stack 2B and the total voltage of the assembled battery 2. Moreover, discharging pathway includes a pathway to discharge the charged second capacitor 12c-2.

Since the first switch 12-1 to the fourth switch 12-4 and the sixth switch 12-6 to the seventh switch 12-7 are controlled to be turned on and off, charging and discharging of the capacitor 12c-1 are controlled.

In the charging pathway of the voltage detecting circuit 12, the first switch 12-1 is provided in series between a positive electrode side of the cell stack 2A and the capacitor 12c-1, and the second switch 12-2 is provided in series between a negative electrode side of the cell stack 2A and the capacitor 12c-1.

Moreover, in the charging pathway of the voltage detecting circuit 12, the third switch 12-3 is provided in series between a positive electrode side of the cell stack 2B and the capacitor 12c-1, and the fourth switch 12-4 is provided in series between a negative electrode side of the cell stack 2B and the capacitor 12c-1.

In the discharging pathway of the voltage detecting circuit 12, the sixth switch 12-6 is provided on the positive electrode side of the cell stacks 2A and 2B, and one end of the sixth switch 12-6 is connected to the capacitor 12c-1. The seventh switch 12-7 is provided on the negative electrode side of the cell stacks 2A and 2B, and one end of the seventh switch 12-7 is connected to the capacitor 12c-1.

Another end of the sixth switch 12-6 is connected to the A/D converter 13 and branches at a branch point A to be connected to a ground of the vehicle body of the vehicle via the first resistor 12r-1. Moreover, another end of the seventh switch 12-7 is connected to the A/D converter 13 and branches at a branch point B to be connected to the ground of the vehicle body of the vehicle via the second resistor 12r-2. The ground of the vehicle body is an example of a ground, and a voltage at the ground is hereinafter referred to as "body voltage."

The A/D converter 13 converts an analog value indicative of a voltage at the branch point A of the voltage detecting circuit 12 into a digital value, and then outputs the converted digital value to the controller 14.

Next described will be a so-called redundant stack monitoring that charges and discharges the capacitor 12c-1 to detect the voltages of the cell stacks 2A and 2B and the assembled battery. A case where the fifth switch 12-5 is turned on and the capacitor 12c-1 and the second capacitor 12c-2 are connected in series is the same.

The capacitor 12c-1 is charged by each of the cell stack 2A, the cell stack 2B and the assembled battery 2 in the voltage detecting circuit 12. In the description below, the term "stack measurement" means a process in which the capacitor 12c-1 is charged by each of the voltages of the cell stacks 2A and 2B, and then each of the voltages of the cell stacks 2A and 2B are measured based on a voltage of the charged capacitor 12c-1. Moreover, the stack measurement may include a process in which the capacitor 12c-1 is charged by the total voltage of the assembled battery 2 and then the total voltage of the assembled battery 2 is measured based on the voltage of the capacitor 12c-1. State monitoring, including charging and discharging of the cell stacks 2A and 2B and the assembled battery 2, performed in the stack measurement is referred to as "redundant stack monitoring."

In a case where the capacitor 12c-1 is charged by the voltage of the cell stack 2A, the first switch 12-1 and the second switch 12-2 are turned on as illustrated in FIG. 2, and the third switch 12-3 to the fourth switch 12-4 and the sixth switch 12-6 to the seventh switch 12-7 are turned off. Thus, a pathway (first pathway) is formed, including the cell stack 2A and the capacitor 12c-1, and thus the capacitor 12c-1 is charged by the voltage of the cell stack 2A.

After a predetermined time period has passed since the first pathway has been formed, the capacitor 12c-1 is discharged. More specifically, the first switch 12-1 and the second switch 12-2 are turned off, and the sixth switch 12-6 and the seventh switch 12-7 are turned on. Thus, a pathway ("second pathway") including the capacitor 12c-1, the first resistor 12r-1 and the second resistor 12r-2 is formed, and then the capacitor 12c-1 is discharged.

Since the other end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned on, into a digital value, and then outputs the converted value to the controller 14. Thus, the voltage of the cell stack 2A is detected.

In a case where the capacitor 12c-1 is charged by the voltage of the cell stack 2B, the third switch 12-3 and the fourth switch 12-4 are turned on as illustrated in FIG. 2, and the first switch 12-1 to the second switch 12-2 and the sixth switch 12-6 to the seventh switch 12-7 are turned off. Thus, a pathway (third pathway) is formed, including the cell stack 2B and the capacitor 12c-1, and thus the capacitor 12c-1 is charged by the voltage of the cell stack 2B.

After a predetermined time period has passed since the third pathway has been formed, the capacitor 12c-1 is discharged. More specifically, the third switch 12-3 and the fourth switch 12-4 are turned off, and the sixth switch 12-6 and the seventh switch 12-7 are turned on. Thus, the second pathway is formed, and then the capacitor 12c-1 is discharged.

Since the other end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned on, into a digital value, and then outputs the converted value to the controller 14. Thus, the voltage of the cell stack 2B is detected.

Moreover, in a case where the capacitor 12c-1 is charged by the total voltage of the assembled battery 2, the first switch 12-1 and the fourth switch 12-4 are turned on as illustrated in FIG. 2, and the second switch 12-2 to the third switch 12-3 and the sixth switch 12-6 to the seventh switch 12-7 are turned off. Thus, a pathway (fourth pathway) is formed, including the assembled battery 2 and the capacitor 12c-1, and thus the capacitor 12c-1 is charged by the total voltage of the assembled battery 2.

After a predetermined time period has passed since the fourth pathway has been formed, the capacitor 12c-1 is discharged. More specifically, the first switch 12-1 and the fourth switch 12-4 are turned off, and the sixth switch 12-6 and the seventh switch 12-7 are turned on. Thus, the second pathway is formed and then the capacitor 12c-1 is discharged.

Since the other end of the sixth switch 12-6 is connected to the A/D converter 13 at the branch point A, the voltage of the capacitor 12c-1 is input to the A/D converter 13. The A/D converter 13 converts an analog voltage value input immediately after the sixth switch 12-6 and the seventh switch 12-7 are turned on, into a digital value, and then outputs the converted value to the controller 14. Thus, the total voltage of the assembled battery 2 is detected.

The first resistor 12r-1 and the second resistor 12r-2 are provided to the voltage detecting circuit 12. Moreover, an insulation resistance Rp on a positive electrode side of the assembled battery 2 and an insulation resistance Rn on a negative electrode side of the assembled battery 2 are provided to the voltage detecting circuit 12. The insulation resistance Rp is an insulation resistance between the positive electrode side of the assembled battery 2 and the vehicle body of the vehicle. The insulation resistance Rn is an insulation resistance between the negative electrode side of the assembled battery 2 and the vehicle body of the vehicle. Deterioration of an insulation resistance of the vehicle is determined based on a voltage to be measured when the capacitor 12c-1 is charged by controlling the switches of the voltage detecting circuit 12 to be turned on and off, as described later. This embodiment employs a DC (direct current) voltage application method for measurement of the insulation resistance of the vehicle.

In the embodiment, each of the insulation resistance Rp and the insulation resistance Rn shows a combined resistance generated by combining a resistance of a mounted resistor with a resistance virtually showing insulation from the ground of the vehicle body. Each of the insulation resistors Rp and Rn may be any one of a mounted resistor and a virtual resistance.

Resistance values of the insulation resistances Rp and Rn are, for example, some MΩ, large enough to be hardly applied at a normal time. However, in an abnormal time in which the insulation resistance Rp or the insulation resistance Rn is deteriorated, the resistance value thereof is reduced to a value that allows the electricity to be conducted due to a short circuit of the assembled battery 2 to the ground of the vehicle body and the like or due to a state close to the short circuit.

The capacitor 12c-1 is charged and discharged to detect deterioration of the insulation resistances Rp and Rn. Here, charging and discharging of the capacitor 12c-1 will be described below. "Rp measurement" is a measurement process of detecting the deterioration of the insulation resistance Rp. In the Rp measurement, the fourth switch 12-4 and the sixth switch 12-6 are turned on, and the second switch 12-2 to the third switch 12-3 and the seventh switch 12-7 are turned off. Thus, the negative electrode side of the assembled battery 2 is connected to the fourth switch 12-4, the capacitor 12c-1, the sixth switch 12-6, the first resistor 12r-1, the ground of the vehicle body, the insulation resistance Rp and the positive electrode side of the assembled battery 2.

In other words, a pathway ("fifth pathway") is formed, connecting the negative electrode side of the assembled battery 2, the fourth switch 12-4, the capacitor 12c-1, the sixth switch 12-6, the first resistor 12r-1, the ground of the vehicle body, the insulation resistance Rp, and the positive electrode side of the assembled battery 2. At this time, in a case where the resistance value of the insulation resistance Rp is normal, the fifth pathway little conducts the electricity so that the capacitor 12c-1 is not charged. On the other hand, in a case where the insulation resistance Rp is deteriorated so that the resistance value thereof is reduced, the fifth pathway conducts electricity so that the capacitor 12c-1 is charged from the positive electrode side (positive voltage).

After a predetermined time period has passed since the fifth pathway has been formed, for example, after the predetermined time period shorter than a time period necessary for the capacitor 12c-1 to be fully charged, the fourth switch 12-4 is turned off. At the same time, the seventh switch 12-7 is turned on. Thus, the second pathway is formed, and then the capacitor 12c-1 is discharged.

Since the other end of the sixth switch 12-6 is connected to the A/D converter 13 at the branch point A, the voltage of the capacitor 12c-1 is input to the A/D converter 13. The A/D converter 13 converts an analog voltage value ("voltage Vcp") input immediately after the fourth switch 12-4 is turned off and the seventh switch 12-7 is turned on, into a digital value, and then outputs the converted value to the controller 14. Thus, the voltage value Vcp is detected. The controller 14 detects the deterioration of the insulation resistance Rp based on the voltage Vcp.

Moreover, "Rn measurement" is a measurement process of detecting the deterioration of the insulation resistance Rn. In the Rn measurement, the first switch 12-1 and the seventh switch 12-7 are turned on, and the second switch 12-2 to the fourth switch 12-4 and the sixth switch 12-6 are turned off. Thus, the positive electrode side of the assembled battery 2 is connected to the first switch 12-1, the capacitor 12c-1, the seventh switch 12-7, the second resistor 12r-2, the ground of the vehicle body, the insulation resistance Rn and the negative electrode side of the assembled battery 2.

In other words, a pathway ("sixth pathway") is formed, connecting the positive electrode side of the assembled battery 2, the first switch 12-1, the capacitor 12c-1, the seventh switch 12-7, the second resistor 12r-2, the ground of the vehicle body, the insulation resistance Rn, and the negative electrode side of the assembled battery 2. At this time, in a case where the resistance value of the insulation resistance Rn is normal, the sixth pathway little conducts the electricity so that the capacitor 12c-1 is not charged. On the other hand, in a case where the insulation resistance Rn is deteriorated so that the resistance value thereof is reduced, the sixth pathway conducts electricity so that the capacitor 12c-1 is charged from the positive electrode side (positive voltage). However, in a case where the PCU 20 generates a boost voltage, described later, the capacitor 12c-1 is charged from the negative electrode side (negative voltage). The capacitor 12c-1 is charged from the negative electrode side because there is a case where the body voltage is higher than the voltage of the assembled battery 2.

After a predetermined time period has passed since the sixth pathway has been formed, for example, after the predetermined time period shorter than the time period necessary for the capacitor 12c-1 to be fully charged, the first switch 12-1 is turned off. At the same time, the sixth switch 12-6 is turned on. Thus, the second pathway is formed, and then the capacitor 12c-1 is discharged.

Since the other end of the sixth switch 12-6 is connected to the A/D converter 13 at the branch point A, the voltage of the capacitor 12c-1 is input to the A/D converter 13. The A/D converter 13 converts an analog voltage value ("voltage Vcn") input immediately after the first switch 12-1 is turned off and the sixth switch 12-6 is turned on, into a digital value, and then outputs the converted value to the controller 14. Thus, the voltage Vcn is detected. The controller 14 detects the deterioration of the insulation resistance Rn based on the voltage Vcn.

(A/D Converter)

The A/D converter 13 detects, at the branch point A, the analog voltage value output from the voltage detecting circuit 12 (FIG. 2), and converts the detected analog voltage value into a digital voltage value. Then, the A/D converter 13 outputs the converted digital voltage value to the controller 14. The A/D converter 13 converts the input voltage into a voltage within a predetermined range so as to detect the voltage.

(Controller)

The controller 14 is a processing apparatus that is a microcomputer and the like including, for example, a central processing unit (CPU), a random access memory (RAM) and a read only memory (ROM). The controller 14 controls the entire battery management ECU 10 including the monitor IC 11a, the monitor IC 11b, the voltage detecting circuit 12, the A/D converter 13, etc. The controller 14 includes a charging pathway forming part 14a, a discharging pathway forming part 14b, a measuring part 14c and an insulation problem detector 14d.

The charging pathway forming part 14a controls turning-on and turning-off of the first switch 12-1 to the seventh switch 12-7 (refer to FIG. 2) included in the voltage detecting circuit 12, and forms the charging pathway in the voltage detecting circuit 12. Moreover, the discharging pathway forming part 14b controls turning-on and turning-off of the first switch 12-1 to the seventh switch 12-7 included in the voltage detecting circuit 12, and forms the discharging pathway in the voltage detecting circuit 12.

Switching patterns to switch the first switch 12-1 to the seventh switch 12-7 are stored beforehand in a memory, such as a RAM and a ROM. The charging pathway forming part 14a and the discharging pathway forming part 14b read out the switching pattern from the memory at an appropriate timing to form the charging pathway or the discharging pathway.

Once the discharging pathway is formed by the discharging pathway forming part 14b, the measuring part 14c detects the voltage of the charged capacitor 12c-1 via the A/D converter 13.

More specifically, the measuring part 14c measures the voltage Vcp based on the voltage of the charged capacitor 12c-1. Similarly, the measuring part 14c measures the voltage Vcn based on the voltage of the charged capacitor 12c-1.

The insulation problem detector 14d detects the deterioration of the insulation resistances Rp and Rn based on measured voltages VRp and VRn of the capacitor 12c-1, on the total voltage of the assembled battery 2 that is obtained from the HV ECU 40, the monitor IC 11a or the monitor IC 11b, and on the boost voltage generated by PCU 20, described later. The total voltage of the assembled battery 2 and the boost voltage are obtained in synchronization with measurement of the voltages VRp and VRn. Then, the insulation problem detector 14d outputs, to the HV ECU 40 that is an upper apparatus, information indicative of a determination result of deterioration (insulation problem detection) of the insulation resistances Rp and Rn (refer to FIG. 1).

In other words, if the insulation resistance Rp or the insulation resistance Rn is deteriorated, voltage charged to the capacitor 12c-1 increases. Therefore, in a case where the voltage of the charged capacitor 12c-1 increases, the deterioration of the insulation resistance Rp or the deterioration of the insulation resistance Rn is detected.

When the voltages VRp and VRn of the capacitor 12c-1 are measured in the Rp measurement and the Rn measurement, the voltage charged to the capacitor 12c-1 is affected by change in the boost voltage generated by the PCU 20 and the total voltage of the assembled battery 2. Since there is a case where the total voltage of the assembled battery 2 and/or the boost voltage generated by the PCU 20 measured in the Rp measurement are different as compared to those voltages measured in the Rn measurement, if the voltages VRp and VRn measured at different time points are treated and used equally to detect the insulation resistances Rp and Rn, credibility of a detection result is low.

In other words, in a case where there is a significant difference between boost voltages generated by the PCU 20 in the measurement Rp and the measurement Rn, the insulation problem detection is not performed because the credibility of the measured voltages Vcp and Vcn is low. The insulation problem detection is performed by comparing a sum of the measured voltages Vcp and Vcn to a threshold value. In a case where boost voltages generated in the Rp measurement and in the Rn measurement are the same, an influence of the boost voltage can be offset by adding the voltage Vcp to the voltage Vcn. In other words, in a case where the boost voltages generated in the Rp measurement and the Rn measurement are significantly different, the influence of the boost voltage cannot be offset by adding the voltage Vcp to the voltage Vcn. Thus, accuracy of the insulation problem detection is lowered.

Moreover, in the case where the boosted voltages generated in the Rp measurement and the Rn measurement are significantly different, the voltages Vcp and Vcn are measured based on different voltages of the power supply that are used to charge and discharge the capacitor 12c-1. Thus, a charging condition is different so that the credibility is low.

The insulation problem detector 14d determines whether or not a difference between boost voltages Vb1 and Vb2 generated by the PCU 20 when the voltages Vcp and Vcn are measured is equal to or less than a first threshold value. The boost voltages Vb1 and Vb2 are obtained from the HV ECU 40 of the upper apparatus. Then, in a case where the difference between the boost voltages Vb1 and Vb2 when the voltages Vcp and Vcn are measured is equal to or smaller than the first threshold value, the insulation problem detector 14d performs a problem determination process, described later, based on the sum of the voltages Vcp and Vcn. However, in a case where the difference between the boost voltages Vb1 and Vb2 measured when the voltages Vcp and Vcn are measured is greater than the first threshold value, the insulation problem detector 14d performs the insulation problem detection, but does not inform the HV ECU 40 of a detection result because the credibility of the detection result is low. Instead, the insulation problem detector 14d may be configured not to perform the insulation problem detection in a case where the difference between the boost voltages Vb1 and Vb2 measured when the voltages Vcp and Vcn are measured is greater than the first threshold value.

The insulation problem detector 14d may be configured to stop the Rp measurement and the Rn measurement in a case where the difference between the boost voltages Vb1 and Vb2 measured when the voltages Vcp and Vcn are measured is greater than the first threshold value. Then, the insulation problem detector 14d discharges the capacitor 12c-1 and then starts a next round of the Rp measurement and the Rn measurement. Thus, the Rp measurement and the Rn measurement to be less accurate do not have to be performed so that the process efficiency can be improved.

In a case where the difference between the boost voltages Vb1 and Vb2 measured when the voltages Vcp and Vcn are measured is equal to or smaller than the first threshold value, the insulation problem detector 14d obtains the voltages of the cell stacks 2A and 2B measured in each measurement, from the monitors IC 11a and 11b. Then, the insulation problem detector 14d calculates the total voltage of the assembled battery 2 by summing obtained voltages, or the insulation problem detector 14d may obtain, from the HV ECU 40, the total voltage of the assembled battery 2 corresponding to a time period in which each of the voltages Vcp and Vcn is detected. In a case where the insulation problem detector 14d obtains the total voltage of the assembled battery 2 from the HV ECU 40, the HV ECU 40 is configured to be informed beforehand of the total voltage of the assembled battery 2.

Then, the insulation problem detector 14d determines whether or not a difference between total voltages Vo1 and Vo2 obtained when the voltages Vcp and Vcn are measured is equal to or less than a second threshold value. Then, in a case where the difference between the total voltages Vo1 and Vo2 obtained when the voltages Vcp and Vcn are measured is greater than the second threshold value, the insulation problem detector 14d corrects the measured voltages Vcp and Vcn based on the total voltages Vo1 and Vo2.

For example, the insulation problem detector 14d corrects the voltages Vcp and Vcn as described below. For example, the insulation problem detector 14d sets, as a base, the total voltage of the assembled battery 2 measured when the voltage Vcp or the voltage Vcn is measured, and then the insulation problem detector 14d obtains a ratio between the total voltages of the assembled battery 2 measured when the voltages Vcp and Vcn are measured. Then, the insulation problem detector 14d corrects the voltages Vcp and Vcn by multiplying the voltage Vcp or the voltage Vcn corresponding to the total voltage of the assembled battery 2 set as the base by the ratio of the total voltages of the assembled battery 2.

More specifically, if the insulation problem detector 14d obtains the total voltage Vo1 of the assembled battery 2 measured when the voltage Vcp is measured and the total voltage Vo2 of the assembled battery 2 measured when the voltage Vcn is measured, and then if the insulation problem detector 14d determines that a difference between the total voltages Vo1 and Vo2 is greater than the second threshold value, the insulation problem detector 14d calculates Vo2/Vo1, for example, based on Vo2. Then, the insulation problem detector 14d corrects the voltage Vcp based on Vcp× (Vo2/Vo1). Thus, the insulation problem detector 14d offsets, at least, a difference between Vo1 and Vo2 so as to perform the insulation problem detection based on the voltages Vcp and Vcn obtained from the adjusted total voltages Vo1 and Vo2 of the assembled battery 2 that are the base.

In a case where the difference between the total voltages of the assembled battery 2 measured when the voltages Vcp and Vcn are measured is equal to or smaller than the second threshold value, the insulation problem detector 14d does not correct the voltages Vcp and Vcn as described above. The insulation problem detector 14d performs the insulation problem detection, described later, based on the voltages Vcp and Vcn. Then, the insulation problem detector 14d informs the HV ECU 40 of the detection result.

The foregoing determination based on the threshold values (hereinafter referred to as "threshold-based determination") is not limited to the threshold-based determination using a difference, but may be a threshold-based determination using a ratio. Moreover, various existing methods may be used to correct the voltages Vcp and Vcn. Further, the foregoing first threshold value is set based on a result of a statistical process after statistics are kept on the boost voltages Vb1 and Vb2 of the PCU 20 in a range in which an insulation problem is not faultily detected due to the boost voltage of the PCU 20. The foregoing second threshold value is set based on a result of a statistical process after statistics are kept on the total voltages Vo1 and Vo2 of the assembled battery 2 in a range in which an insulation problem is not faultily detected due to the total voltage of the assembled battery 2.

The insulation problem detector 14d may switch the foregoing first threshold value at an appropriate timing based on the result of the statistical process of accumulated data about the boost voltages Vb1 and Vb2 of the PCU 20. Similarly, the insulation problem detector 14d may switch the foregoing second threshold value at an appropriate timing based on the result of the statistical process of accumulated data about the total voltages Vo1 and Vo2 of the assembled battery 2. Thus, the accuracy of the insulation problem detection can be improved because the first and second threshold values are adjusted based on change of the boost voltage and the total voltage of the assembled battery 2.

(PCU)

The PCU 20 boosts a voltage of the power supply to be supplied to the motor 4 and other electronic and electrical equipment of the vehicle, and also converts the voltage from DC voltage to AC voltage. As illustrated in FIG. 1, the PCU 20 is connected to the positive and negative electrode sides of the assembled battery 2. The PCU 20 includes a DCDC converter 21, a three-phase inverter 22, a low pressure-side smoothing capacitor 23a and a high pressure-side smoothing capacitor 23b.

(MG ECU)

The MG ECU 30 is an electronic control apparatus that monitors a state of the PCU 20 and that controls the PCU 20. More specifically, the MG ECU 30 monitors operation states of the DCDC converter 21 and the three-phase inverter 22, and also monitors charged states of the low pressure-side smoothing capacitor 23a and the high pressure-side smoothing capacitor 23b. Then, the MG ECU 30 obtains information indicative of presence or absence of a boost to the PCU 20 and the boost voltage, and then informs the HV ECU 40 that is an upper apparatus thereof of the information. Moreover, the MG ECU 30 controls operations of the PCU 20 based on a command from the HV ECU 40.

(HV ECU)

The HV ECU 40 controls the vehicle, including the battery management ECU 10 and the MG ECU 30 based on a notification provided by the battery management ECU 10 of a monitoring result of a charged state and the like of the assembled battery 2 and information provided by the MG ECU 30 about presence or absence of a boost to the PCU 20 and the boost voltage.

(Insulation Problem Detection Process)

Figure 3A:
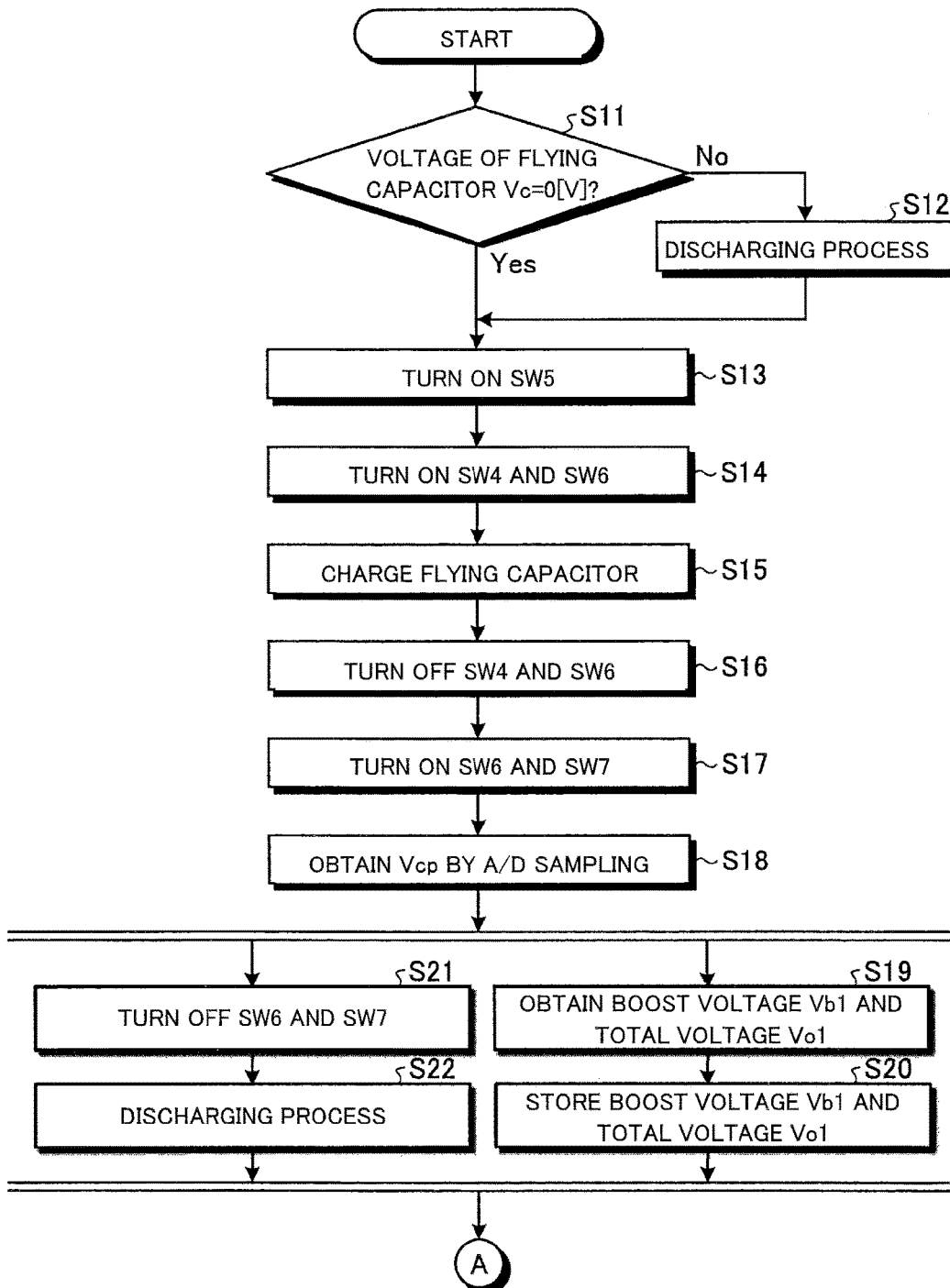
FIG. 3A is a flowchart (No. 1) showing an example of an insulation problem detection process of this embodiment.
Figure 3B:
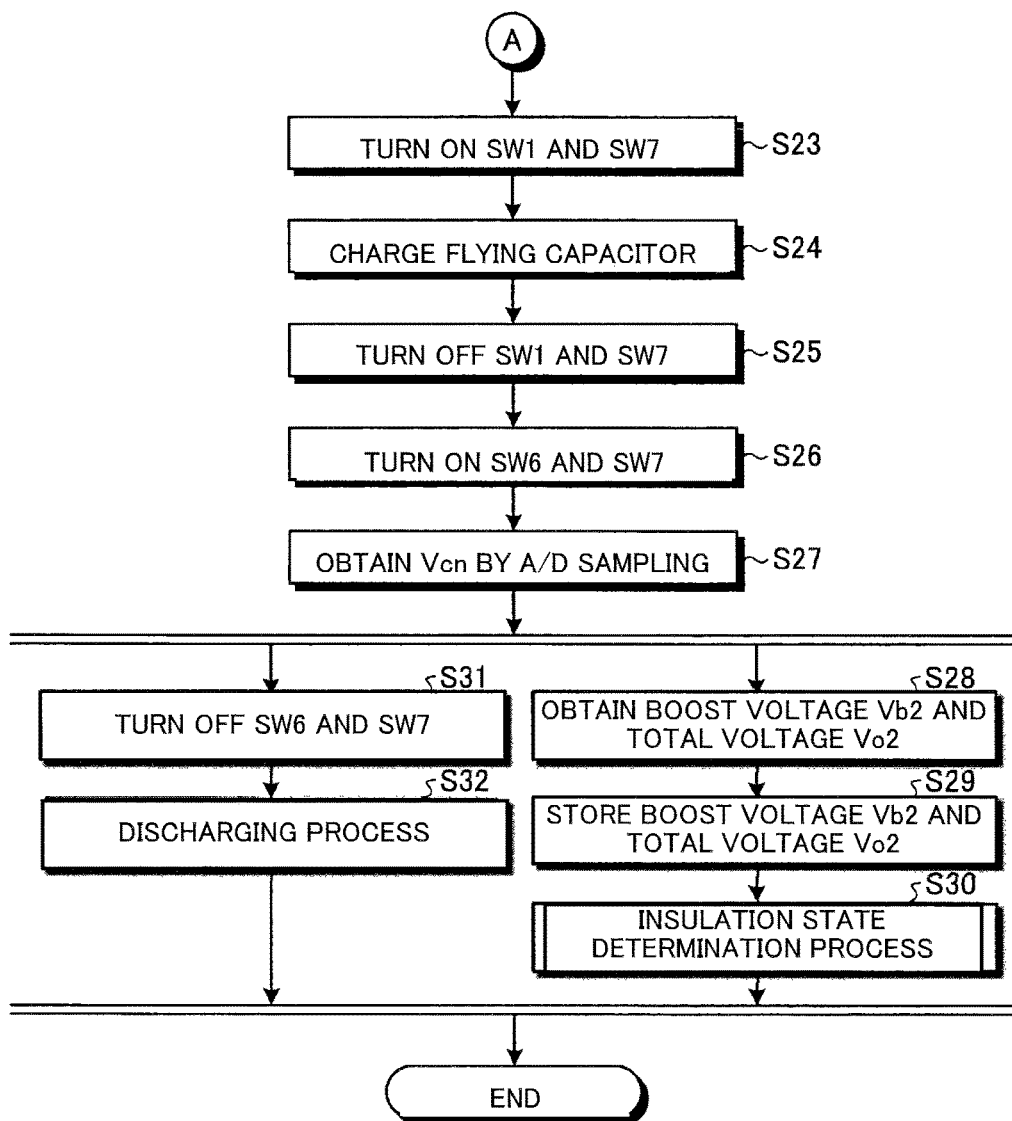
FIG. 3B is a flowchart (No. 2) showing an example of the insulation problem detection process of this embodiment.

FIG. 3A is a flowchart (No. 1) showing an example of an insulation problem detection process of this embodiment. Moreover, FIG. 3B is a flowchart (No. 2) showing an example of the insulation problem detection process of this embodiment. The insulation problem detection process is performed by the controller 14 included in the battery management ECU 10 in a predetermined time cycle or at a predetermined event, such as when the vehicle is started, when the vehicle is stopped, or at a predetermined interval or at every predetermined traveling distance.

In the description below, the first switch 12-1, the second switch 12-2, the third switch 12-3 and the fourth switch 12-4 illustrated in FIG. 2 are abbreviated as "SW1," "SW2," "SW3" and "SW4," respectively. Similarly, the fifth switch 12-5, the sixth switch 12-6 and the seventh switch 12-7 illustrated in FIG. 2 are abbreviated as "SW5," "SW6," and "SW7," respectively.

First, the measuring part 14c determines whether or not a voltage Vc of the flying capacitor (i.e. the capacitor 12c-1) is zero (0) (or substantially zero), i.e. a state in which the flying capacitor is fully discharged (a step S11). In a case where the voltage Vc of the flying capacitor is zero (Yes in the step S11), the measuring part 14c moves the process to a step S13. On the other hand, in a case where the voltage Vc of the flying capacitor is not zero (No in the step S11), the measuring part 14c moves the process to a step S12.

In the step S12, the discharging pathway forming part 14b forms a discharging pathway to perform a discharging process for the flying capacitor (i.e. the capacitor 12c-1). Once the step S12 ends, the controller 14 moves the process to the step S13.

In the step S13, the charging pathway forming part 14a turns on the SW5 to form a flying capacitor including the capacitors 12c-1 and 12c-2 connected to each other in parallel. Thus, a capacitance of the flying capacitor increases. A voltage charged to the flying capacitor in the insulation problem detection is very small as compared to a voltage measured when a stack voltage is measured. Therefore, the voltage charged to the flying capacitor is greatly affected by a stray capacitance. The influence of the stray capacitance can be decreased by increasing the capacitance of the flying capacitor. The step S13 is skipped if the configuration does not need to change over the flying capacitors or if flying capacitors do not have to be changed over.

Next, the charging pathway forming part 14a turns on the SW4 and the SW6 (a step S14). The foregoing charging fifth pathway is formed by the step S14 so that the flying capacitor is charged (a step S15). Next, the discharging pathway forming part 14b turns off the SW4 and the SW6 (a step S16). Next, the discharging pathway forming part 14b turns on the SW6 and the SW7 (a step S17). Next, the measuring part 14c obtains the voltage Vcp based on a voltage of the flying capacitor sampled by the A/D converter 13 (a step S18).

The steps S14 to S18 described above are the Rp measurement. In order to smooth change of the boost voltage of the flying capacitor while being charged and change of the total voltage of the assembled battery 2, an average voltage obtained by repeating the steps S14 to S18 predetermined times may be used as a finalized voltage Vcp.

Once the step S18 ends, steps S19 to S20 and steps S21 to S22 are performed in parallel.

In the step S19, the measuring part 14c obtains, from the HV ECU 40, the boost voltage Vb1 having a timestamp corresponding to a time period in which the steps S14 to S18 are performed. In a case where the voltage Vcp is calculated by averaging voltages obtained from the predetermined times of the repetition of the steps S14 to S18, the measuring part 14c may obtain the boost voltage Vb1 by averaging boost voltages each of which has the timestamp corresponding to each time period in which the steps S14 to S18 are performed.

In the step S19, the measuring part 14c obtains, from the monitor ICs 11a and 11b (or the HV ECU 40), the total voltage Vo1 of the assembled battery 2. The obtained total voltage Vo1 has a timestamp corresponding to the time period in which the steps S14 to S18 are performed. In a case where the voltage Vcp is calculated by averaging voltages obtained from the predetermined times of the repetition of the measurement Rp, the measuring part 14c may obtain the total voltage Vo1 by averaging total voltages each of which has the timestamp corresponding to each time period in which the steps S14 to S18 are performed.

Next, the measuring part 14c stores the boost voltage Vb1 and the total voltage Vo1 obtained in the step S19 to a memory, not illustrated (a step S20). Once the step S20 ends, the controller 14 moves the process to a step S23 shown in FIG. 3B.

Moreover, in the step S21, the discharging pathway forming part 14b turns off the SW6 and the SW7. In the step S22, the SW2 and the SW3 are tuned on to perform the discharging process for the flying capacitor. The flying capacitor can be discharged while the SW6 and the SW7 are continuously on. However, in that case, a time period for discharging the flying capacitor is longer due to the first resistor 12r-1 and the second resistor 12r-2. On the other hand, if the SW2 and the SW3 are turned on, there is no resistor in the discharging pathway. Thus, the time period for discharging the flying capacitor can be shortened. Once the step S22 ends, the controller 14 moves the process to the step S23 shown in FIG. 3B.

In the step S23 shown in FIG. 3B, the charging pathway forming part 14a turns on the SW1 and the SW7. As a result of the step S23, the charging sixth pathway is formed to charge the flying capacitor (a step S24). Next, the discharging pathway forming part 14b turns off the SW1 and the SW7 (a step S25). Next, the discharging pathway forming part 14b turns on the SW6 and the SW7 (a step S26). Next, the measuring part 14c obtains the voltage Vcn based on the voltage of the flying capacitor sampled by the A/D converter 13 (a step S27).

The steps S23 to S27 described above are the Rn measurement. In order to smooth change of the boost voltage of the flying capacitor while being charged and change of the total voltage of the assembled battery 2, an average voltage obtained by repeating the steps S23 to S27 predetermined times may be used as a finalized voltage Vcn.

Once the step S27 ends, steps S28 to S30 and steps S31 to S32 are performed in parallel.

In the step S28, the measuring part 14c obtains, from the HV ECU 40, the boost voltage Vb2 having a timestamp corresponding to a time period in which the steps S23 to S27 are performed. In a case where the voltage Vcn is calculated by averaging voltages obtained from the predetermined times of the repetition of the steps S23 to S27, the measuring part 14c may obtain the boost voltage Vb2 by averaging boost voltages each of which has the timestamp corresponding to each time period in which the steps S23 to S27 are performed.

In the step S28, the measuring part 14c obtains, from the monitor ICs 11a and 11b (or the HV ECU 40), the total voltage Vo2 of the assembled battery 2. The obtained total voltage Vo2 has a timestamp corresponding to the time period in which the steps S23 to S27 are performed. In a case where the voltage Vcn is calculated by averaging voltages obtained from the predetermined times of the repetition of the measurement Rn, the measuring part 14c may obtain the total voltage Vo2 by averaging the total voltages each of which has the timestamp corresponding to each time period in which the steps S23 to S27 are performed.

Next, the measuring part 14c stores the boost voltage Vb2 and the total voltage Vo2 obtained in the step S28 to a memory, not illustrated (a step S29). Then, the insulation problem detector 14d performs an insulation state determination process, described later with reference to FIG. 4 (a step S30). Once the step S30 ends, the controller 14 ends the insulation problem detection process.

Moreover, in a step S31, the discharging pathway forming part 14b turns off the SW6 and the SW7. After the step S31, a similar discharging process performed in the step S22 for the flying capacitor is performed (a step S32). Once the step S32 ends, the controller 14 ends the insulation problem detection process.

An order of performing two process groups, one of which includes the steps S14 to S18 and the other includes the steps S23 to S27, may be changed if an order of process steps in each group is not changed. In other words, the Rp measurement may be performed after the Rn measurement.

(Insulation State Determination Process)

Figure 4:
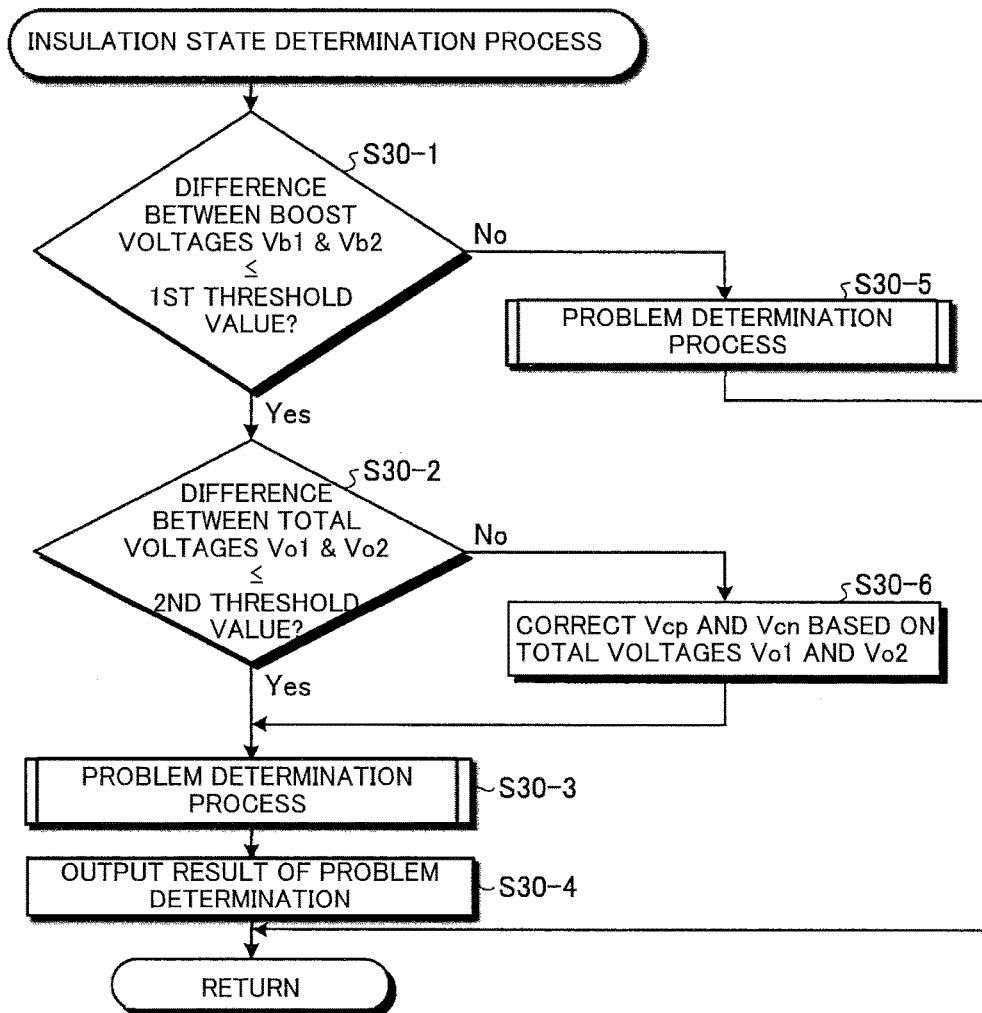
FIG. 4 is a flowchart showing an example of an insulation state determination process of this embodiment.

FIG. 4 is a flowchart showing an example of the insulation state determination process of this embodiment. FIG. 4 shows a subroutine of the step S30 in FIG. 3B.

First, the insulation problem detector 14d determines whether or not the difference between the boost voltages Vb1 and Vb2 is equal to or less than the first threshold value (a step S30-1). In a case where the difference between the boost voltages Vb1 and Vb2 is equal to or less than the first threshold value (Yes in the step S30-1), the insulation problem detector 14d moves the process to a step S30-2. On the other hand, in a case where the difference between the boost voltages Vb1 and Vb2 is greater than the first threshold value (No in the step S30-1), the insulation problem detector 14d moves the process to a step S30-5.

In the step S30-2, the insulation problem detector 14d determines whether or not the difference between the total voltages Vo1 and Vo2 is equal to or less than the second threshold value. In a case where the difference between the total voltages Vo1 and Vo2 is equal to or less than the second threshold value (Yes in the step S30-2), the insulation problem detector 14d moves the process to a step S30-3. On the other hand, in a case where the difference between the total voltages Vo1 and Vo2 is greater than the second threshold value (No in the step S30-2), the insulation problem detector 14d moves the process to a step S30-6.

In the step S30-3, the insulation problem detector 14d performs the problem determination process, described later with reference to FIG. 5. Once the step S30-3 ends, the insulation problem detector 14d moves the process to a step S30-4. In the step S30-4, the insulation problem detector 14d outputs a result of the problem determination obtained in the step S30-3, to the HV ECU 40. Once the step S30-4 ends, the insulation problem detector 14d ends the insulation state determination process, and returns to the insulation problem detection process in FIG. 3B, and then ends the insulation problem detection process.

Moreover, in the step S30-5, the insulation problem detector 14d performs the problem determination process, described later with reference to FIG. 5. Once the step S30-5 ends, the insulation problem detector 14d ends the insulation state determination process, and returns to the insulation problem detection process in FIG. 3B, and then ends the insulation problem detection process.

In the step S30-6, the insulation problem detector 14d corrects the voltages Vcp and Vcn based on the total voltages Vo1 and Vo2. In a case where the difference between the total voltages Vo1 and Vo2 is equal to or less than the second threshold value (Yes in the step S30-2), the insulation problem detector 14d does not correct the voltages Vcp and Vcn, as corrected in the step S30-6. However, correcting no voltages Vcp and Vcn is referred to as zero correction in this embodiment. Once the step S30-6 ends, the insulation problem detector 14d moves the process to the step S30-3.

In the insulation state determination process in FIG. 4, the threshold-based determination of the total voltage is performed in the step S30-2 after the threshold-based determination of the boost voltage in the step S30-1. However, an order of determination is not limited to this, but the order may be changed. Moreover, one of the threshold-based determinations of the boost voltage in the step S30-1 and the total voltage in the step S30-2 may be performed.

In a case where one of threshold-based determinations of the boost voltage in the step S30-1 and the total voltage in the step S30-2 is performed, the boost voltage Vb1 or the total voltage Vo1 to be determined in the threshold-based determination may be obtained and stored in the steps S19 and S20 in FIG. 3A. Moreover, in the case where one of the threshold-based determinations of the boost voltage in the step S30-1 and the total voltage in the step S30-2 is performed, the boost voltage Vb2 or the total voltage Vo2 to be determined in the threshold-based determination may be obtained and may be stored in the steps S28 and S29 in FIG. 3B.

Moreover, in a case where the boost voltage is determined to be No in the step S30-1 of the insulation state determination process in FIG. 4, the step S30-5 is performed and then the insulation state determination process ends. However, the process is not limited to this but after the step S30-5 is performed, the process may be moved to the step S30-4, or in the case where the boost voltage is determined to be No in the step S30-1 of the insulation state determination process in FIG. 4, the insulation state determination process may be ended immediately.

(Problem Determination Process)

Figure 5:
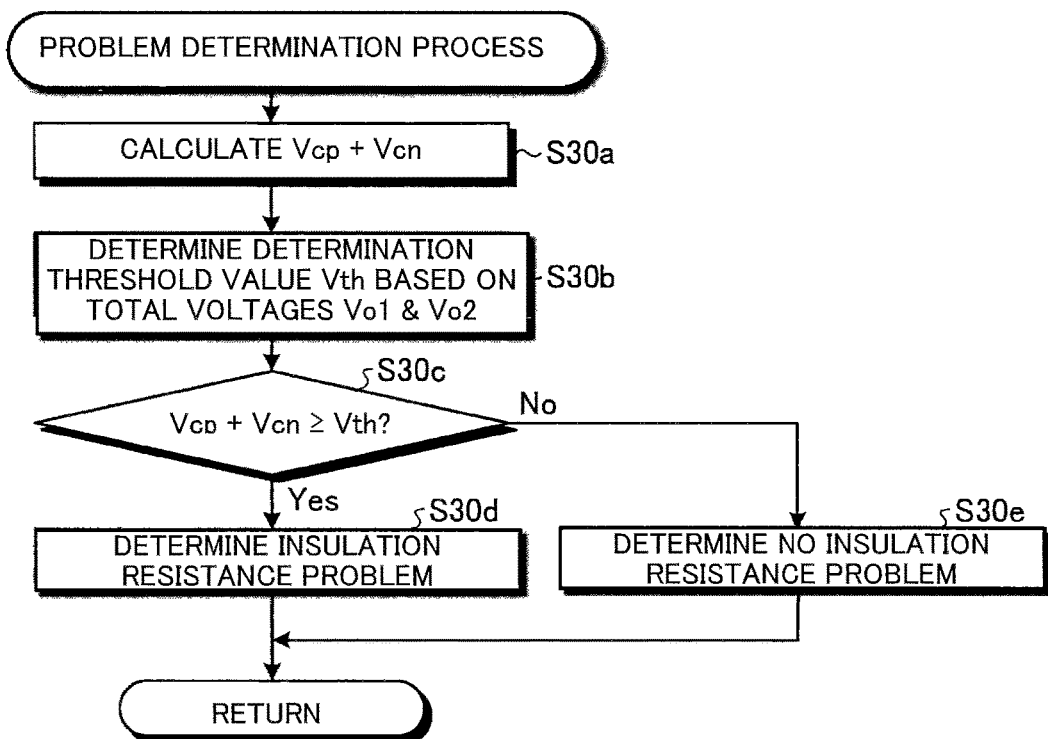
FIG. 5 is a flowchart showing an example of a problem determination process of this embodiment.

FIG. 5 is a flowchart showing an example of the problem determination process of this embodiment. FIG. 5 shows a subroutine of the step S30-3 and the step S30-5 in FIG. 4.

First, the insulation problem detector 14d calculates the voltage Vcp+the voltage Vcn (a step S30a). Next, the insulation problem detector 14d determines a determination threshold value Vth based on the total voltages Vo1 and Vo2 (a step S30b). Next, the insulation problem detector 14d determines whether or not Vcp+Vcn≥Vth (a step S30c). In a case where the insulation problem detector 14d determines that Vcp+Vcn≥Vth (Yes in the step S30c), the insulation problem detector 14d moves the process to a step S30d. On the other hand, in a case where the insulation problem detector 14d determines that Vcp+Vcn<Vth (No in the step S30c), the insulation problem detector 14d moves the process to a step S30e.

The insulation problem detector 14d detects deterioration of the insulation resistances Rp and Rn in the step S30d, and determines an insulation resistance problem. The insulation problem detector 14d does not detect deterioration of the insulation resistances Rp and Rn in the step S30e and determines that the insulation resistances are normal.

Once the step S30d or the step S30e ends, in a case where the insulation problem detector 14d performs the problem determination process in the step S30-3, the insulation problem detector 14d ends the problem determination process and returns to the insulation state determination process in FIG. 4, and then moves the process to the step S30-4. Moreover, once the step S30d or the step S30e ends, in a case where the insulation problem detector 14d performs the problem determination process in the step S30-5, the insulation problem detector 14d ends the problem determination process, returns to the insulation problem detection process in FIG. 3B and then ends the insulation problem detection process.

When determining, in the step S30b, the determination threshold value Vth that is used in the step S30c, based on the total voltages Vo1 and Vo1, the insulation problem detector 14d may determine the threshold value Vth by multiplying an average voltage of the total voltages Vo1 and Vo2 by an integer number. If the threshold value for determining deterioration of the insulation resistances Rp and Rn is changed and determined, as necessary, based on the total voltages Vo1 and Vo2 that are obtained from an external apparatus, an insulation resistance problem can be detected more accurately as compared to use of the total voltage of the battery that is obtained by the stack measurement.

(Timing Chart of the Insulation Problem Detection Process)

Figure 6:
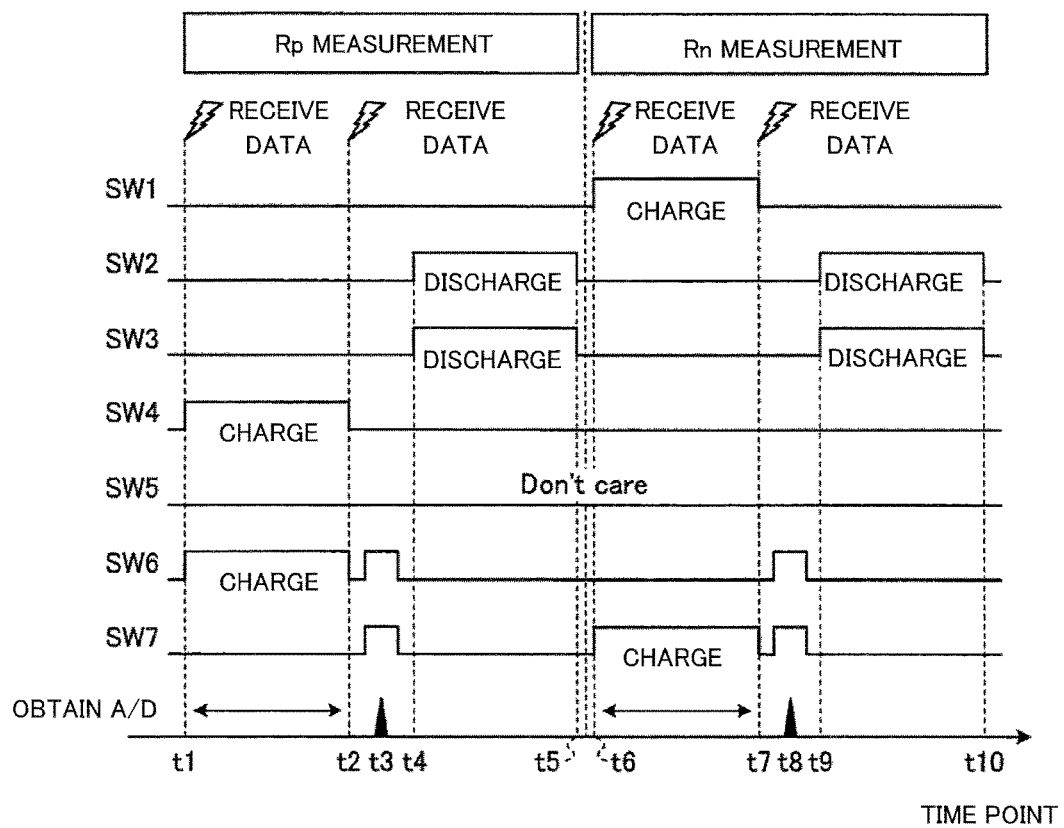
FIG. 6 is a timing chart showing an example of the insulation problem detection process of this embodiment.

FIG. 6 is a timing chart showing an example of the insulation problem detection process of this embodiment. As shown in FIG. 6, the battery management ECU 10 performs the Rp measurement in a time period from a time point t1 to a time point t5. The battery management ECU 10 turns on the SW4 and the SW6 in a time period from the time point t1 to a time point t2 to charge the flying capacitor (battery charge) in the Rp measurement.

The battery management ECU 10 receives stack voltages of the cell stacks 2A and 2B from the monitor ICs 11a and IC 11b the predetermined times in the time period from the time point t1 to the time point t2, and calculates the total voltage of the assembled battery 2. Then, the battery management ECU 10 finalizes the total voltage of the assembled battery 2, for example, by averaging the received the total voltages of the assembled battery 2, or the battery management ECU 10 receives the total voltage of the assembled battery 2 the predetermined times from the HV ECU 40 in the time period from the time point t1 to the time point t2. Then, the battery management ECU 10 finalizes the total voltage of the assembled battery 2, for example, by averaging the received total voltages of the assembled battery 2.

Moreover, the battery management ECU 10 receives the boost voltage of the PCU 20 the predetermined times from the HV ECU 40 in the time period from the time point t1 to the time point t2. Then, the battery management ECU 10 finalizes the boost voltage of the PCU 20, for example, by averaging the received boost voltages of the PCU 20.

Then, the battery management ECU 10 turns on the SW6 and the SW7 at a time point t3 to measure the voltage Vcp by sampling the voltage of the flying capacitor by the A/D converter 13. Then, the battery management ECU 10 turns on the SW2 and the SW3 in a time period from a time point t4 to the time point t5 to discharge the flying capacitor.

As shown in FIG. 6, the battery management ECU 10 performs the Rn measurement in a time period from a time point t6 to a time point t10. The battery management ECU 10 turns on the SW1 and the SW7 in a time period from the time point t6 to a time point t7 to charge the flying capacitor in the Rn measurement.

Moreover, the battery management ECU 10 receives the stack voltages of the cell stacks 2A and 2B from the monitor ICs 11a and 11b the predetermined times in the time period from the time point t6 to the time point t7 to calculate the total voltage of the assembled battery 2. The battery management ECU 10 finalizes the total voltage of the assembled battery 2, for example, by averaging the received total voltages of the assembled battery 2, or the battery management ECU 10 receives the total voltage of the assembled battery 2 from the HV ECU 40 the predetermined times in the time period from the time point t6 to the time point t7. Then, the battery management ECU 10 finalizes the total voltage of the assembled battery 2, for example, by averaging the received total voltages of the assembled battery 2.

Moreover, the battery management ECU 10 receives the boost voltage of the PCU 20 from the HV ECU 40 the predetermined times in the time period from the time point t6 to the time point t7. Then, the battery management ECU 10 finalizes the boost voltage of the PCU 20, for example, by averaging the received boost voltages of the PCU 20.

Then, the battery management ECU 10 turns on the SW6 and the SW7 at a time point t8 to measure the voltage Vcn by sampling the voltage of the flying capacitor by the A/D converter 13. Then, the battery management ECU 10 turns on the SW2 and the SW3 in a time period from a time point t9 to a time point t10 to discharge the flying capacitor.

According to the embodiment described above, since the insulation problem of the vehicle is detected, adapting, as necessary, change of the total voltage of the power supply and the boost voltage of a voltage boosting apparatus obtained from an external apparatus, accuracy of the insulation problem detection can be improved. Moreover, since the total voltage of the power supply is obtained from another apparatus, not depending on measurement using the flying capacitor, a processing time period can be shortened. In addition, the accuracy of the insulation problem detection can be improved because the total voltage of the power supply is obtained from the external apparatus so that the total voltage is used that is free from influence. Further, it is possible to prevent decrease of the accuracy of the insulation problem detection due to change of the boost voltage of the voltage boosting apparatus and also possible to shorten the time period and improve an efficiency of the insulation problem detection process by decreasing false insulation problem detection.

[Modifications]

(1) Minimum Configuration of Insulation Problem Detection Apparatus

In the embodiment, the voltage detecting circuit 12 and the A/D converter 13 perform the insulation problem detection process under control of the controller 14 in the battery management ECU 10, based on the total voltage of the power supply and the boost voltage of the voltage boosting apparatus obtained from the external apparatus. However, a minimum configuration of the insulation problem detection apparatus is not limited to this configuration, but a configuration including the voltage detecting circuit 12, the A/D converter 13 and the controller 14 may be regarded as a minimum configuration of the insulation problem detection apparatus.

(2) Apparatus that Performs the Insulation Problem Detection Process

In the embodiment, the battery management ECU 10 performs the insulation problem detection process. However, an apparatus that performs the insulation problem detection process is not limited to the battery management ECU 10, but the HV ECU 40 may partially or entirely perform the insulation problem detection process. For example, since the total voltage of the power cell and the boost voltage are information controlled by the HV ECU 40, the process is performed using the information. The HV ECU 40, for example, may perform the insulation state determination process and the problem determination process in FIGS. 4 and 5.

(3) Insulation Problem Detection Based on Presence/Absence of Boost Voltage

In the embodiment, in the case where a difference of the boost voltages of the voltage boosting apparatus that are informed from the HV ECU 40, the upper apparatus, in the measurement Rp and the measurement Rn, is equal to or greater than the threshold value, the insulation problem detection process is not performed, or the result of the insulation problem detection process is not provided to the HV ECU 40, the upper apparatus. However, the configuration is not limited to this. In a case where a boost voltage equal to or greater than a predetermined value is informed from the HV ECU 40, the upper apparatus, the insulation problem detection process itself may not be performed.

(4) Case where an Insulation Problem is Detected a Plurality of Times in a Row

In the embodiment, in a case where an insulation problem is detected once, the problem is informed to the HV ECU 40 that is the upper apparatus, and the like. However, the configuration is not limited to this. In a case where an insulation problem is detected a plurality of times in a row, the problem may be informed to the HV ECU 40 that is the upper apparatus, and the like. Thus, the accuracy of the insulation problem detection can be further improved.

It is possible for a person skilled in the art to come up with further effects and modifications. Therefore, a broader aspect of the invention is not limited to the specific details, the embodiment and the modifications expressed and described above. Therefore, this invention can be modified without departing from the spirit or the scope of the comprehensive concept of the invention defined by the attached claims and equivalents thereof.

While the invention has been shown and described in detail, the foregoing description is in all aspects illustrative and not restrictive. It is therefore understood that numerous other modifications and variations can be devised without departing from the scope of the invention.

What is claimed is:

1. An insulation problem detection apparatus comprising a microcomputer configured to:
control a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged;
obtain a total voltage of the power supply from an external apparatus that is external to the microcomputer when the insulation resistance of the vehicle is measured by the voltage detecting circuit; and
detect whether there is an insulation problem of the vehicle based on (i) the total voltage of the power supply obtained from the external apparatus and (ii) the insulation resistance of the vehicle measured by the voltage detecting circuit,
wherein the power supply is a battery of the vehicle, and the total voltage of the power supply is a total voltage of cells of the battery obtained at a same time that the insulation resistance of the vehicle was measured by the voltage detecting circuit.

2. The insulation problem detection apparatus according to claim 1, wherein the microcomputer
controls the voltage detecting circuit to measure a first insulation resistance and a second insulation resistance of the vehicle;
obtains a first total voltage of the power supply when the first insulation resistance is measured by the voltage detecting circuit and a second total voltage of the power supply when the second insulation resistance is measured by the voltage detecting circuit; and
detects whether there is the insulation problem of the vehicle based on the first total voltage, the second total voltage, the first insulation resistance and the second insulation resistance, the first and second insulation resistances being adjusted based on a difference between the first and second total voltages.

3. The insulation problem detection apparatus according to claim 2, wherein
the microcomputer determines, based on the first and second total voltages, a threshold value that is used to determine the first and second insulation resistances.

4. An insulation problem detection apparatus comprising a microcomputer configured to:
control a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged;
obtain, from an external apparatus that is external to the microcomputer, a boost voltage of a boosting circuit that boosts an output voltage output by the power supply mounted in the vehicle, when the insulation resistance of the vehicle is measured by the voltage detecting circuit; and
detect whether there is an insulation problem of the vehicle based on the insulation resistance of the vehicle measured by the voltage detecting circuit in accordance with the boost voltage obtained from the external apparatus.

5. The insulation problem detection apparatus according to claim 4, wherein the microcomputer
controls the voltage detecting circuit to measure a first insulation resistance and a second insulation resistance of the vehicle;
obtains a first boost voltage of the boosting circuit when the first insulation resistance is measured by the voltage detecting circuit and a second boost voltage of the boosting circuit when the second insulation resistance is measured by the voltage detecting circuit; and
does not detect whether there is the insulation problem of the vehicle when a difference between the first and second boost voltages obtained from the external apparatus is equal to or greater than a predetermined threshold value.

6. The insulation problem detection apparatus according to claim 5, wherein when the microcomputer determines that a difference between the first and second boost voltages is equal to or greater than the predetermined threshold value, the microcomputer:
stops the voltage detecting circuit from measuring the first and second insulation resistances of the vehicle;
stops obtaining the first and second boost voltages from the external apparatus; and
stops detecting whether there is the insulation problem of the vehicle.

7. An insulation problem detection method that is executed by a microcomputer, the insulation problem detection method comprising the steps of:
(a) controlling a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged;
(b) obtaining a total voltage of the power supply from an external apparatus that is external to the microcomputer when the insulation resistance of the vehicle is measured by the voltage detecting circuit by the step (a); and
(c) detecting whether there is an insulation problem of the vehicle based on (i) the total voltage of the power supply obtained from the external apparatus by the step (b) and (ii) the insulation resistance of the vehicle measured by the voltage detecting circuit by the step (a),
wherein the power supply is a battery of the vehicle, and the total voltage of the power supply is a total voltage of cells of the battery obtained at a same time that the insulation resistance of the vehicle was measured by the voltage detecting circuit.

8. The insulation problem detection method according to claim 7, wherein
the step (a) includes controlling the voltage detecting circuit to measure a first insulation resistance and a second insulation resistance of the vehicle;
the step (b) includes obtaining a first total voltage of the power supply when the first insulation resistance is measured by the voltage detecting circuit and a second total voltage of the power supply when the second insulation resistance is measured by the voltage detecting circuit; and
the step (c) includes detecting whether there is the insulation problem of the vehicle based on the first total voltage, the second total voltage, the first insulation resistance and the second insulation resistance, the first and second insulation resistances being adjusted based on a difference between the first and second total voltages.

9. The insulation problem detection method according to claim 8, further comprising
determining, based on the first and second total voltages, a threshold value that is used to determine the first and second insulation resistances.

10. An insulation problem detection method that is executed by a microcomputer, the insulation problem detection method comprising the steps of:
 (a) controlling a voltage detecting circuit to measure an insulation resistance of a vehicle based on a voltage at which a capacitor in the vehicle is charged, the microcomputer controlling the voltage detecting circuit to connect the capacitor in series to a power supply mounted in the vehicle and a ground of a body of the vehicle to measure the voltage at which the capacitor is charged;
 (b) obtaining, from an external apparatus that is external to the microcomputer, a boost voltage of a boosting circuit that boosts an output voltage output by the power supply mounted in the vehicle, when the insulation resistance of the vehicle is measured by the voltage detecting circuit by the step (a); and
 (c) detecting whether there is an insulation problem of the vehicle based on the insulation resistance of the vehicle measured by the voltage detecting circuit by the step (a) in accordance with the boost voltage obtained from the external apparatus by the step (b).

11. The insulation problem detection method according to claim 10, wherein
 the step (a) includes controlling the voltage detecting circuit to measure a first insulation resistance and a second insulation resistance of the vehicle;
 the step (b) includes obtaining a first boost voltage of the boosting circuit when the first insulation resistance is measured by the voltage detecting circuit and a second boost voltage of the boosting circuit when the second insulation resistance is measured by the voltage detecting circuit; and
 the step (c) does not detect whether there is the insulation problem of the vehicle when a difference between the first and second boost voltages obtained from the external apparatus is equal to or greater than a predetermined threshold value.

12. The insulation problem detection method according to claim 11, wherein, when it is determined that the difference between the first and second boost voltages is equal to or greater than the predetermined threshold value,
 stopping the voltage detecting circuit from measuring the first and second insulation resistances of the vehicle;
 stopping obtaining the first and second boost voltages from the external apparatus; and
 stopping detecting whether there is the insulation problem of the vehicle.

\* \* \* \* \*